(12) United States Patent
Susuki

(10) Patent No.: US 7,999,594 B2
(45) Date of Patent: Aug. 16, 2011

(54) SEMICONDUCTOR INTEGRATED CIRCUIT AND CONTROL SIGNAL DISTRIBUTION METHOD

(75) Inventor: Masato Susuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/585,962

(22) Filed: Sep. 29, 2009

(65) Prior Publication Data

US 2010/0019823 A1    Jan. 28, 2010

Related U.S. Application Data

(63) Continuation of application No. PCT/JP2007/056967, filed on Mar. 29, 2007.

(51) Int. Cl.
*H03K 3/00*    (2006.01)
(52) U.S. Cl. ............ 327/295; 327/291; 365/230.03
(58) Field of Classification Search ............... None
See application file for complete search history.

(56) References Cited

U.S. PATENT DOCUMENTS

| | | | |
|---|---|---|---|
| 5,666,322 A | 9/1997 | Conkle | 365/233 |
| 6,097,663 A | 8/2000 | Watanabe et al. | 365/230.03 |
| 7,420,871 B2 * | 9/2008 | Chu | 365/233.1 |
| 7,616,043 B2 * | 11/2009 | Takano | 327/295 |
| 2001/0028593 A1 | 10/2001 | Sekiguchi et al. | 365/230.03 |
| 2002/0060595 A1 | 5/2002 | Nakano | 327/295 |
| 2006/0039227 A1 | 2/2006 | Lai et al. | 365/230.03 |
| 2006/0194160 A1 | 8/2006 | Kokuo et al. | 431/12 |

FOREIGN PATENT DOCUMENTS

| | | |
|---|---|---|
| JP | 10-065124 | 3/1998 |
| JP | 2001-273764 | 10/2001 |
| JP | 2002-158286 | 5/2002 |
| JP | 2006-228325 | 8/2006 |

OTHER PUBLICATIONS

European Search Report dated May 7, 2010 and issued in corresponding European Patent Application 07740405.1.
International Search Report issued on May 15, 2007 in PCT Application No. PCT/JP2007/056967.

* cited by examiner

*Primary Examiner* — An T Luu
(74) *Attorney, Agent, or Firm* — Staas & Halsey LLP

(57) ABSTRACT

A semiconductor integrated circuit includes a plurality of areas, each of which generates phase clocks in accordance with an external clock and control signals and performs a predetermined process assigned to each of the phase clocks. The semiconductor integrated circuit includes a control signal distributing unit that adjusts a timing at which the control signal is turned ON or OFF for each of the areas and distributes the adjusted control signals to the plurality of areas so that the plurality of areas do not perform a same process at a same timing.

2 Claims, 8 Drawing Sheets

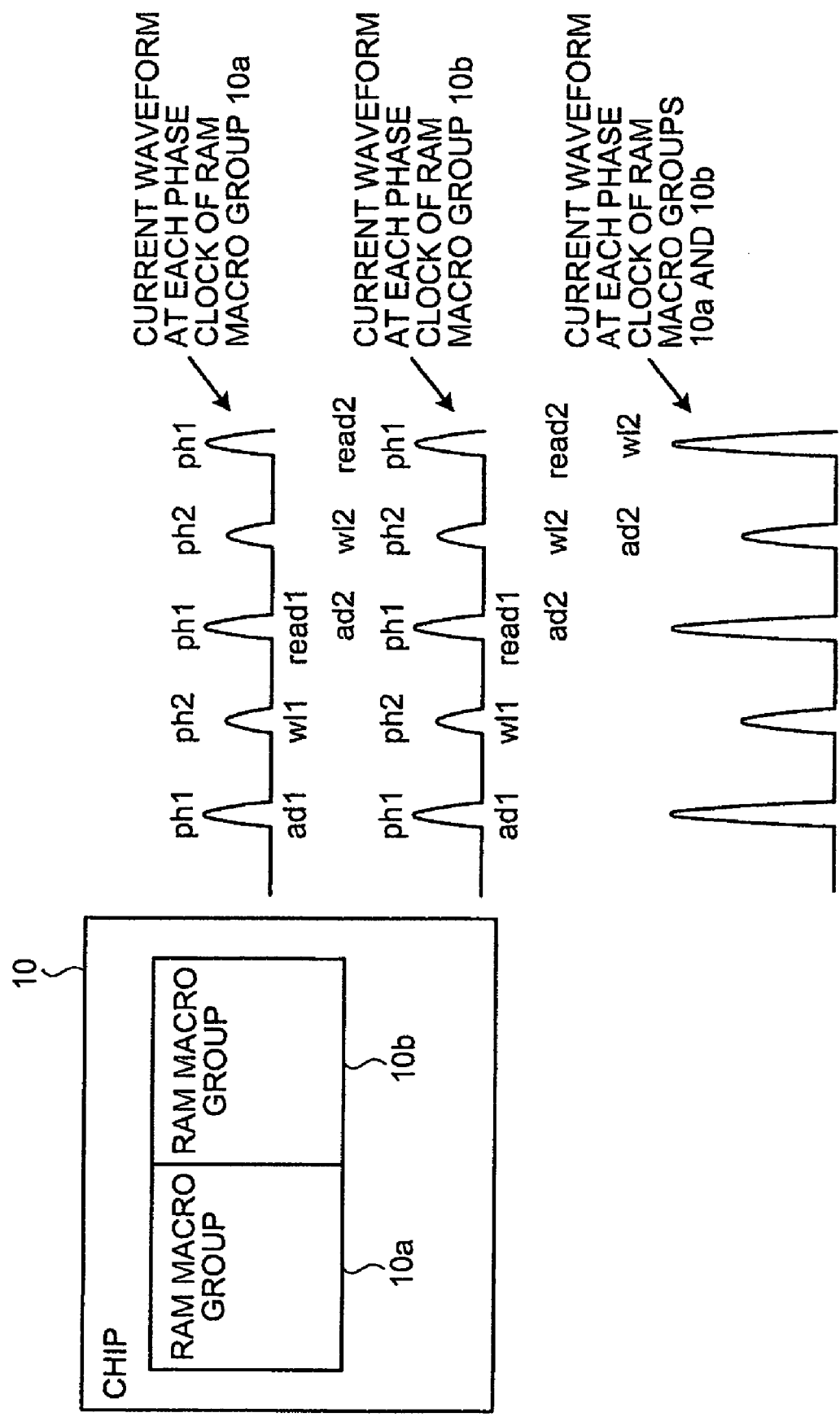

SEMICONDUCTOR INTEGRATED CIRCUIT AND CONTROL SIGNAL DISTRIBUTION METHOD

CROSS-REFERENCE TO RELATED APPLICATION(S)

This application is a continuation of PCT international application Ser. No. PCT/JP2007/56967 filed on Mar. 29, 2007 which designates the United States, the entire contents of which are incorporated herein by reference.

FIELD

The embodiment discussed herein is directed to a semiconductor integrated circuit and a control signal distribution method.

BACKGROUND

A RAM (Random Access Memory) macro that performs a predetermined process in synchronization with a clock may generate phase clocks that are used inside the RAM macro in accordance with an external clock in some cases, for example, in order to perform pipeline processing inside the RAM macro (see Japanese Laid-open Patent Publication No. 2002-158286). The RAM macro is a circuit configured to perform a predetermined process and is mounted on a chip such as CPU (Central Processing Unit).

For example, the external clock is classified into two phase clocks, the phase clocks are respectively referred to as a phase 1 clock (hereinafter, "ph1") and a phase 2 clock (hereinafter, "ph2"), and predetermined processes are assigned to the respective phase clocks. For example, the writing of data and the reading of data are performed at ph1 and the control of word line and the control of memory cell are performed at ph2. When RAM macros as described above are mounted on a chip, such as a CPU, switching between ph1 and ph2 is performed on all the RAM macros in the same manner in many cases because of the convenience of clock distribution and CPU setting.

SUMMARY

According to an aspect of the invention, a semiconductor integrated circuit includes a plurality of areas, each of which generates phase clocks in accordance with an external clock and control signals and performs a predetermined process assigned to each of the phase clocks. The semiconductor integrated circuit includes a control signal distributing unit that adjusts a timing at which the control signal is turned ON or OFF for each of the areas and distributes the adjusted control signals to the plurality of areas so that the plurality of areas do not perform a same process at a same timing.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIG. 8 is a diagram explaining the problem of a conventional art.

DESCRIPTION OF EMBODIMENT(S)

Figure 1:
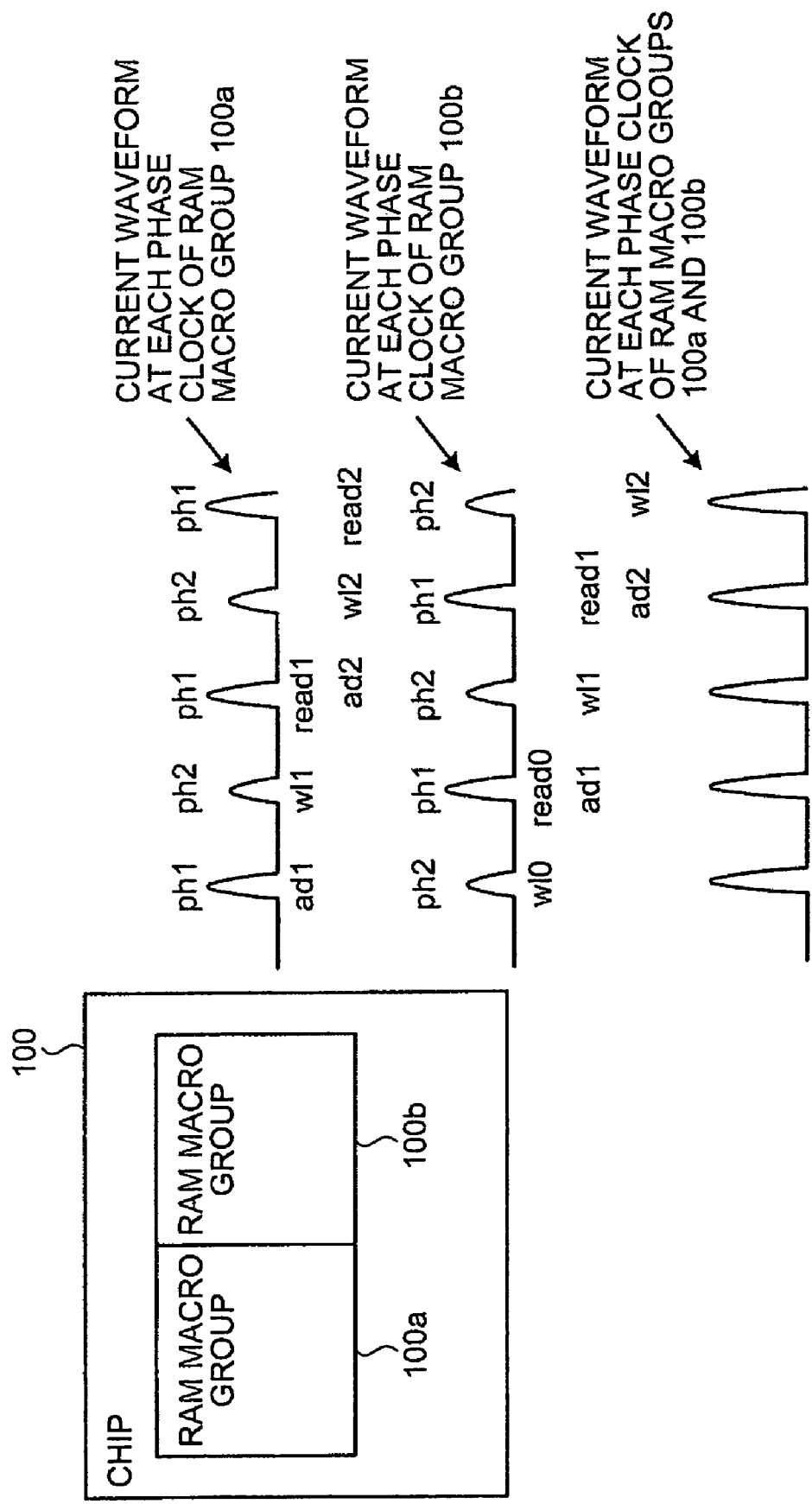
FIG. 1 is a diagram explaining an outline and a feature of a chip according to the present embodiment.

In the previously-described conventional art, there is a problem that the generation of noise and the power supply drop increase, because switching between ph1 and ph2 is performed on RAM macros mounted on a chip, such as a CPU, in the same manner in the conventional art.

FIG. 8 is a diagram explaining the problem of a conventional art. As illustrated in FIG. 8, a chip 10 mounts thereon RAM macro groups 10a and 10b and performs switching between ph1 and ph2 on the RAM macro groups 10a and 10b in the same manner.

The waveform located at the first stage on the right side of the drawing represents a current waveform for phase clocks of the RAM macro group 10a, the waveform located at the second stage on the right side represents a current waveform for phase clocks of the RAM macro group 10b, and the waveform located at the third stage on the right side represents a current waveform for all the phase clocks of the RAM macro groups 10a and 10b. In both the RAM macro groups 10a and 10b, necessary electric currents are large at ph1, at which addressing (ad) or data reading (read) is performed, and necessary electric currents are small at ph2, at which line selection (wl) is performed.

In this manner, when switching between ph1 and ph2 is performed in the same manner, the timings at which currents are large and the timings at which currents are small of the RAM macro group 10a coincide with those of the RAM macro group 10b (currents are large at the timing of ph1 and currents are small at the timing of ph2 in an example illustrated in FIG. 8). The current range for each of ph1 and ph2 has a large difference. Therefore, this leads to increase the generation of noise and the drop of power supply.

Preferred embodiments of a semiconductor integrated circuit and a control signal distribution method according to the present invention will be explained below in detail with reference to the accompanying drawings. The present invention is not limited to the embodiments explained below.

First, an outline and a feature of a chip (a semiconductor integrated circuit) according to the present embodiment will be explained. FIG. 1 is a diagram explaining an outline and a feature of a chip 100 according to the present embodiment. As illustrated in FIG. 1, the chip 100 mounts thereon RAM macro groups 100a and 100b. The RAM macro groups 100a and 100b generate a phase 1 clock (hereinafter, "ph1") and a phase 2 clock (hereinafter, "ph2") based on an external clock supplied from an outside and phase control signals supplied from the chip 100.

The RAM macro groups 100a and 100b assign a predetermined process to each phase clock in advance, and execute the predetermined process for each phase clock. In an example illustrated in FIG. 1, the RAM macro groups 100a and 100b assign addressing (ad) and data reading (read) to ph1 and assign line selection (wl) to ph2.

In FIG. 1, the waveform located at the first stage on the right side represents a current waveform for phase clocks of the RAM macro group 100a and the waveform located at the second stage on the right side represents a current waveform for phase clocks of the RAM macro group 100b. As illustrated in FIG. 1, in both the RAM macro groups 100a and 100b, the value of electric currents is not less a predetermined value at the timing ph1 and the value of electric currents is less than the predetermined value at the timing ph2.

As described in FIG. 8, when switching between ph1 and ph2 is performed in the same manner, the timings at which currents are large and the timings at which currents are small of the RAM macro group 100a coincide with those of the RAM macro group 100b. The current range for each of ph1 and ph2 has a large difference. Therefore, the chip 100 according to the present embodiment adjusts phase control signals to be input into the RAM macro groups 100a and 100b so that each phase clock of the RAM macro group 100a does not coincide with each phase clock of the RAM macro group 100b. In an example illustrated in FIG. 1, the chip 100 adjusts the phase control signals so that the phase clocks ph1 of the RAM macro group 100a sequentially coincide with the phase clocks ph2 of the RAM macro group 100b.

In this manner, because the chip 100 according to the present embodiment adjusts the phase control signals, two current waveforms corresponding to two phase clocks applied to the RAM macro groups 100a and 100b have a constant size. In other words, the current range for each phase clock has a small difference (see the third stage on the right side of FIG. 1). Therefore, it is possible to prevent the increase of the generation of noise and the drop of power supply.

Figure 2:
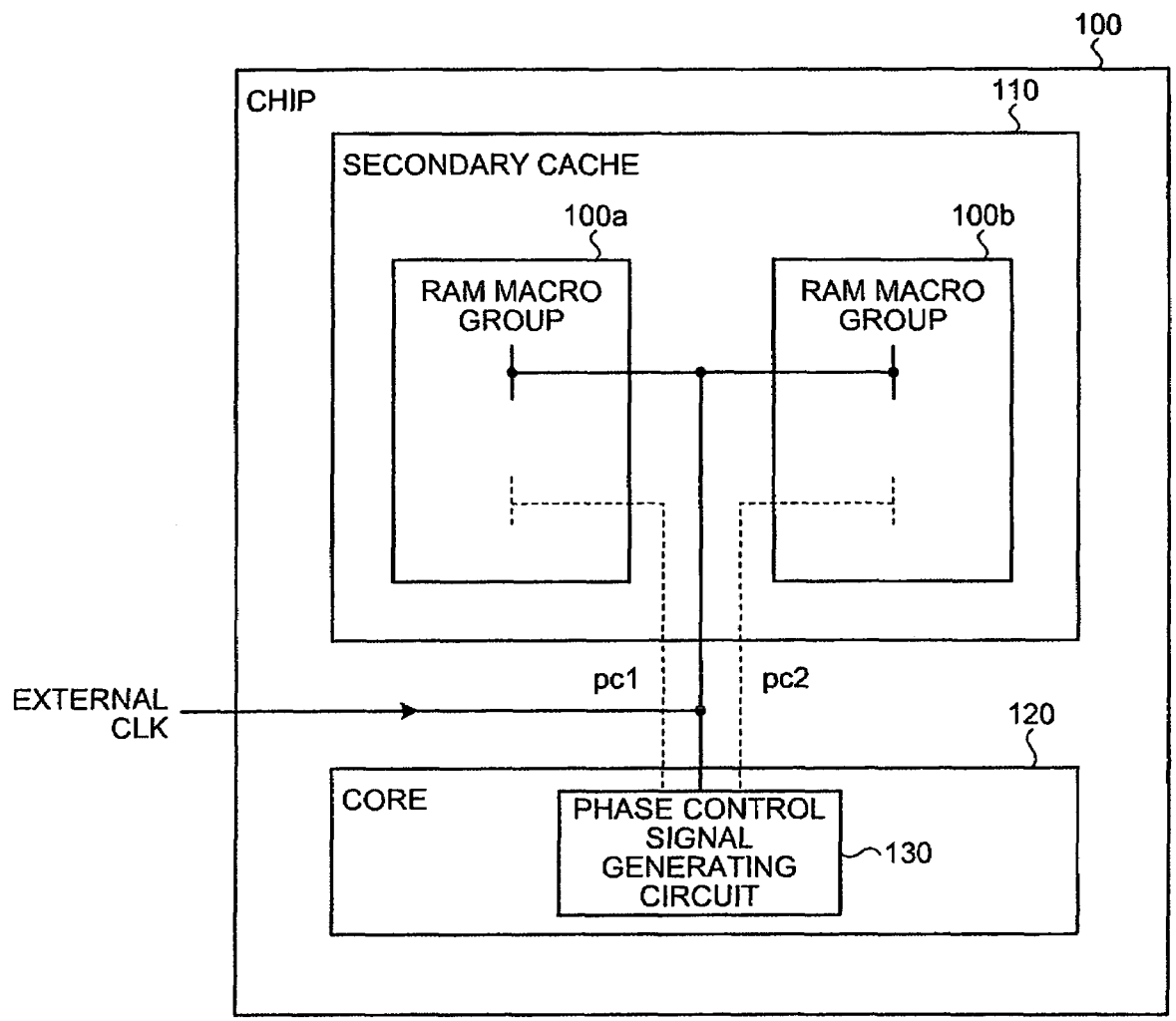
FIG. 2 is a functional block diagram illustrating the configuration of the chip according to the present embodiment.

Next, the configuration of the chip 100 according to the present embodiment will be explained. FIG. 2 is a functional block diagram illustrating the configuration of the chip 100 according to the present embodiment. As illustrated in FIG. 2, the chip 100 includes a secondary cache 110 and a core 120.

The secondary cache 110 is a storage unit that acquires various types of data to be used in the core 120 from an external device (not illustrated) and temporarily stores therein the acquired various types of data. Particularly, the secondary cache 110 according to the present invention includes the RAM macro groups 100a and 100b.

The RAM macro groups 100a and 100b are units that generate the phase clocks ph1 and ph2 based on an external clock supplied from an outside and phase control signals output from a phase control signal generating circuit 130 (the phase control signal generating circuit 130 will be described below) and perform predetermined processes at timings at which the phase clocks are generated.

Figure 3:
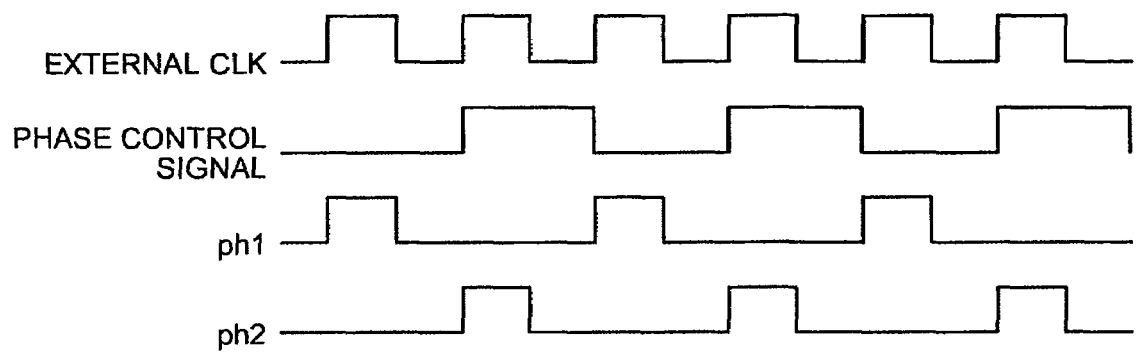
FIG. 3 is a diagram explaining a method by which phase clocks ph1 and ph2 are generated by a RAM macro group.

Now, a method by which the phase clocks ph1 and ph2 are generated by the RAM macro group 100a will be explained. Because a method by which the phase clocks are generated by the RAM macro group 100b is the same as the method by the RAM macro group 100a, its description is omitted. FIG. 3 is a diagram explaining a method by which the phase clocks ph1 and ph2 are generated by the RAM macro group.

As illustrated in FIG. 3, when the RAM macro group 100a generates ph1, the RAM macro group 100a compares an ON/OFF (high/low) state of the external clock and an ON/OFF (high/low) state of the phase control signal. Then, the RAM macro group 100a sets ph1 to ON (high) and ph2 to OFF (low) when the phase control signal is OFF (low) and the external clock is ON (high). The RAM macro group 100a also sets ph1 to OFF (low) and ph2 to ON (high) when the phase control signal is ON (high).

Moreover, when the RAM macro group 100a generates ph2, the RAM macro group 100a compares an ON/OFF (high/low) state of the external clock and an ON/OFF (high/low) state of the phase control signal. Then, the RAM macro group 100a sets ph1 to OFF (low) and ph2 to ON (high) when the phase control signal is ON (high) and the external clock is ON (high). The RAM macro group 100a also sets ph1 to ON (high) and ph2 to OFF (low) when the phase control signal is OFF (low).

Figure 4:
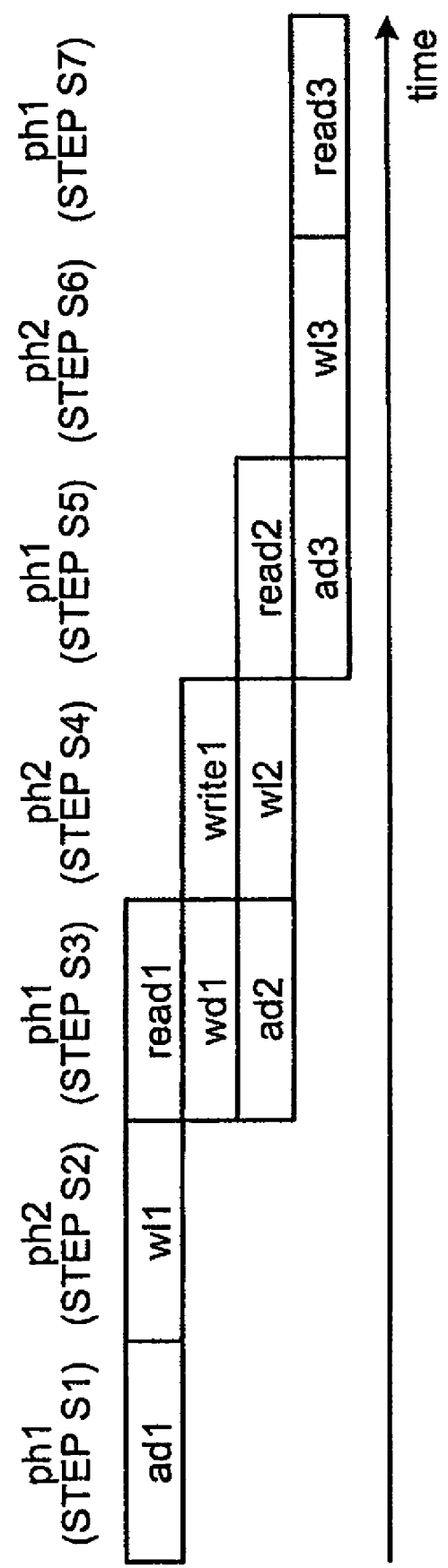
FIG. 4 is a diagram explaining pipeline processing of the RAM macro group.

The RAM macro group 100a generates ph1 and ph2 based on the external clock and the phase control signal as described in FIG. 3 and assigns a predetermined process to each of the generated phase clock signals to perform a pipeline processing. FIG. 4 is a diagram explaining pipeline processing performed by the RAM macro group 100a. Because pipeline processing performed by the RAM macro group 100b is similar to pipeline processing performed by the RAM macro group 100a, its description is omitted.

As illustrated in FIG. 4, the RAM macro group 100a executes ad1 (the selection of address) at ph1 (Step S1), executes wl1 (the selection of line to be read) at ph2 (Step S2), and executes read1 (the reading of data), wd1 (the selection of line to be written, and ad2 (the selection of address) at ph1 (Step S3). Particularly, a power consumption becomes large at ph1 at which the reading of data is performed (the power consumption becomes is not less than a predetermined value). A power consumption becomes small at ph2 at which the other processes are performed (the power consumption is less than the predetermined value).

Next, the RAM macro group 100a executes write1 (the writing of data) and wl2 (the selection of line to be read) at ph2 (Step S4), executes read2 (the reading of data) and ad3 (the selection of address) at ph1 (Step S5), executes wl3 (the selection of line to be read) at ph2 (Step S6), and executes read3 (the reading of data) at ph1 (Step S7).

Referring back to explanation of FIG. 2, the core 120 is a control unit that operates based on the external clock input from the outside and includes a computing unit for executing a predetermined program and a primary cache for storing therein various types of data. The core 120 performs various processes by using these components. Particularly, the core 120 according to the present invention mounts thereon the phase control signal generating circuit 130.

The phase control signal generating circuit 130 is a device that generates phase control signals and inputs the generated phase control signals into the RAM macro groups 100a and 100b. Hereinafter, the phase control signal to be input into the RAM macro group 100a is denoted by pc1 and the phase control signal to be input into the RAM macro group 100b is denoted by pc2.

Particularly, the phase control signal generating circuit 130 according to the present embodiment generates pc1 and pc2 so that an ON/OFF (high/low) timing of pc1 and an ON/OFF (high/low) timing of pc2 are opposite to each other. In other words, the phase control signal generating circuit 130 generates pc1 and pc2 so that the ON (high) timing of pc1 is the OFF (low) timing of pc2 and the OFF (low) timing of pc1 is the ON (high) timing of pc2.

Figure 5:
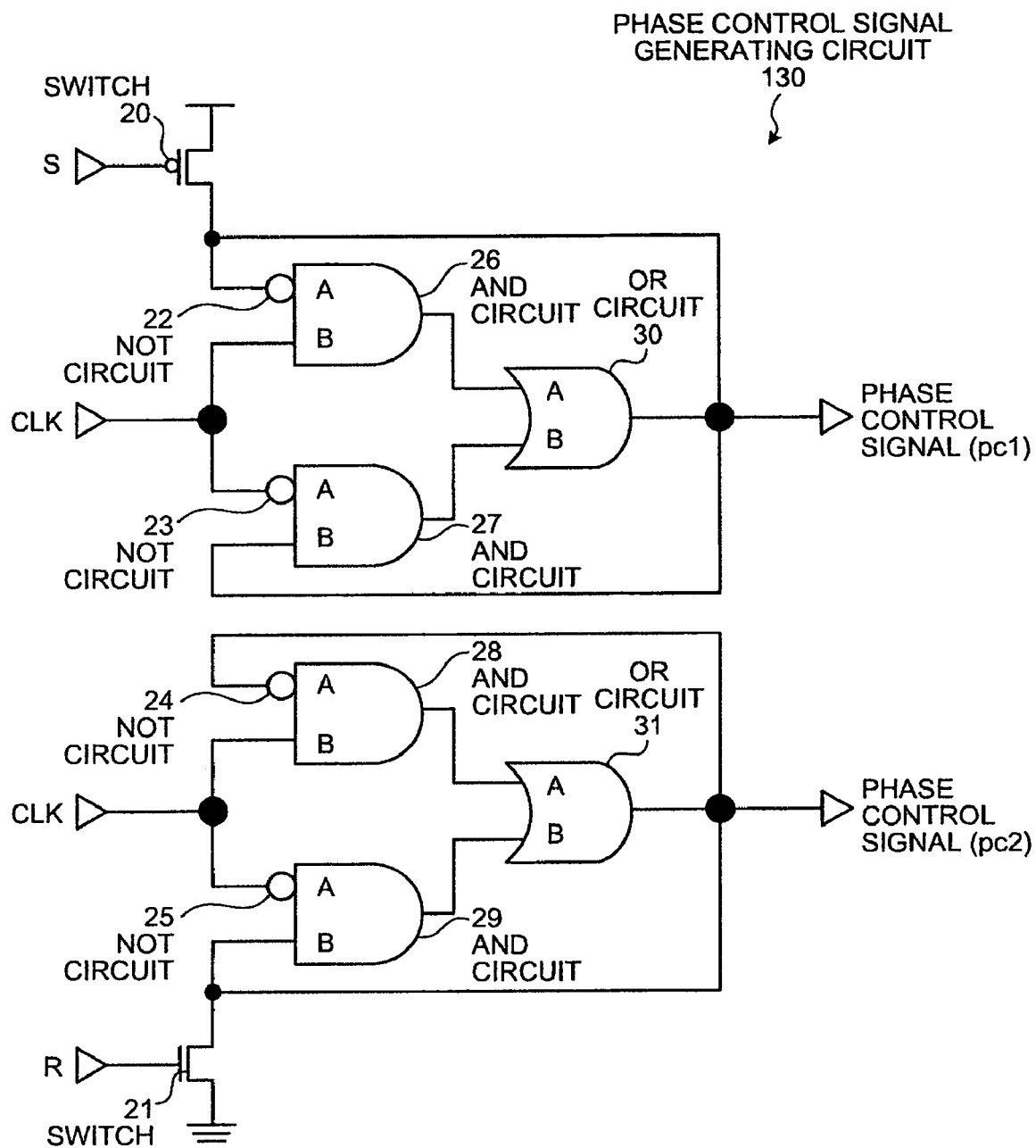
FIG. 5 is a diagram illustrating an example of the circuit configuration of a phase control signal generating circuit.

Now, the circuit configuration of the phase control signal generating circuit 130 will be explained. FIG. 5 is a diagram illustrating an example of the circuit configuration of the phase control signal generating circuit 130. As illustrated in FIG. 5, the phase control signal generating circuit 130 includes switches 20 and 21, NOT circuits 22 to 25, AND circuits 26 to 29, and OR circuits 30 and 31.

The switch 20 of them is a switch that is turned on or off in accordance with an electrical signal S input from the outside. Specifically, the switch 20 is turned off for a time period for which the electrical signal S is ON (high) and the switch 20 is turned on for a time period for which the electrical signal S is OFF (low). When the switch 20 is turned on, "High" is inputted into the NOT circuit 22. It is assumed that the electrical signal S is input from the core 120.

The switch 21 is a switch that is turned on or off in accordance with an electrical signal R input from the outside. Specifically, the switch 21 is turned on for a time period for which the electrical signal R is ON (high) and the switch 21 is turned off for a time period for which the electrical signal R is OFF (low). When the switch 21 is turned on, "Low" is input into the AND circuit 29. It is assumed that the electrical signal R is input from the core 120.

The NOT circuit 22 is a circuit that reverses an input signal and inputs the inversed signal into an A terminal of the AND circuit 26. Specifically, when the NOT circuit 22 receives "High", the NOT circuit 22 inputs "Low" into the A terminal of the AND circuit 26. On the other hand, when the NOT circuit 22 receives "Low", the NOT circuit 22 inputs "High" into the A terminal of the AND circuit 26.

The NOT circuit 23 is a circuit that reverses an input signal and inputs the inversed signal into an A terminal of the AND circuit 27. Specifically, when the NOT circuit 23 receives "High", the NOT circuit 23 inputs "Low" into the A terminal of the AND circuit 27. On the other hand, when the NOT circuit 23 receives "Low", the NOT circuit 23 inputs "High" into the A terminal of the AND circuit 27.

The NOT circuit 24 is a circuit that reverses an input signal and inputs the reversed signal into an A terminal of the AND circuit 28. Specifically, when the NOT circuit 24 receives "High", the NOT circuit 24 inputs "Low" into the A terminal of the AND circuit 28. On the other hand, when the NOT circuit 24 receives "Low", the NOT circuit 24 inputs "High" into the A terminal of the AND circuit 28.

The NOT circuit 25 is a circuit that reverses a value of an input signal and inputs the reversed signal into an A terminal of the AND circuit 29. Specifically, when the NOT circuit 25 receives "High", the NOT circuit 25 inputs "Low" into the A terminal of the AND circuit 29. On the other hand, when the NOT circuit 25 receives "Low", the NOT circuit 25 inputs "High" into the A terminal of the AND circuit 29.

The AND circuit 26 is a circuit that performs a logical product on signals input from terminals A and B and inputs the result into an A terminal of the OR circuit 30. Specifically, the AND circuit 26 outputs "High" when the signals input from the terminals A and B are "High" and outputs "Low" when at least one of the signals are "Low".

The AND circuit 27 is a circuit that performs a logical product on signals input from terminals A and B and inputs the result into a B terminal of the OR circuit 30. Specifically, the AND circuit 27 outputs "High" when the signals input from the terminals A and B are "High" and outputs "Low" when at least one of the signals are "Low".

The AND circuit 28 is a circuit that performs a logical product on signals input from terminals A and B and inputs the result into an A terminal of the OR circuit 31. Specifically, the AND circuit 28 outputs "High" when the signals input from the terminals A and B are "High" and outputs "Low" when at least one of the signals are "Low".

The AND circuit 29 is a circuit that performs a logical product on signals input from terminals A and B and inputs the result into a B terminal of the OR circuit 31. Specifically, the AND circuit 29 outputs "High" when the signals input from the terminals A and B are "High" and outputs "Low" when at least one of the signals are "Low".

The OR circuit 30 is a circuit that performs a logical sum on signals input from the terminals A and B and inputs the result into the RAM macro group 100a as the phase control signal (pc1). Specifically, the OR circuit 30 outputs "High" when any one of the signals input from the terminals A and B is "High" and outputs "Low" when the signals are "Low". Moreover, the signal output from the OR circuit 30 is fed back to the NOT circuit 22 and the B terminal of the AND circuit 27.

The OR circuit 31 is a circuit that performs a logical sum on signals input from the terminals A and B and inputs the result into the RAM macro group 100b as the phase control signal (pc2). Specifically, the OR circuit 31 outputs "High" when any one of the signals input from the terminals A and B is "High" and outputs "Low" when the signals are "Low". Moreover, the signal output from the OR circuit 31 is fed back to the NOT circuit 24 and the B terminal of the AND circuit 29.

Figure 6:
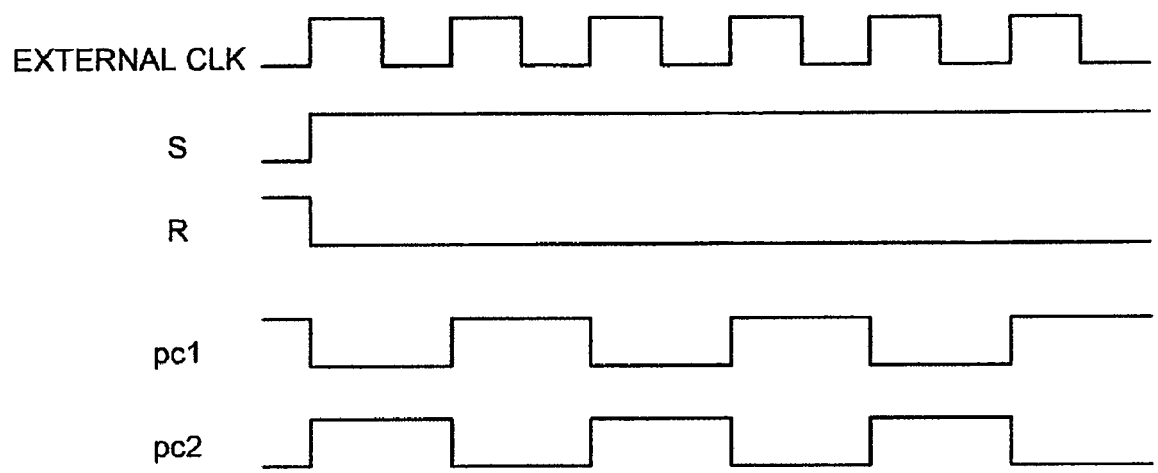
FIG. 6 is a diagram illustrating a timing chart of the phase control signal generating circuit.

Next, it will be explained about a relationship between the electrical signals S and R, the external clocks, and the phase control signals pc1 and pc2 of the phase control signal generating circuit 130 described in FIG. 5. FIG. 6 is a diagram illustrating a timing chart of the phase control signal generating circuit 130. As illustrated in FIG. 6, the phase control signals pc1 and pc2 whose on/off states are opposite to each other can be generated by switching the value of the electrical signal S from an initial state "Low" to "High", switching the value of the electrical signal R from an initial state "High" to "Low", and inputting the external clock into the phase control signal generating circuit 130.

Figure 7:
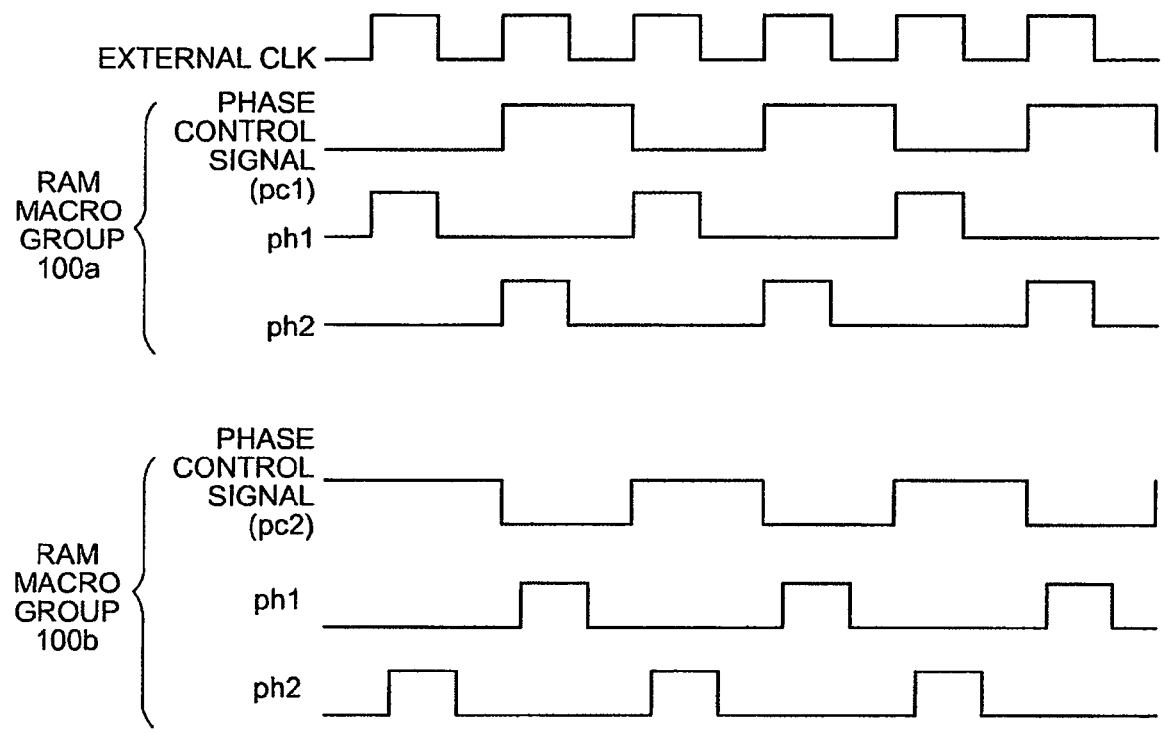
FIG. 7 is a timing chart of each phase clock when phase control signals pc1 and pc2 are input into the RAM macro groups.

Now, it will be explained about a relationship between the phase clocks when the phase control signals pc1 and pc2 are input into the RAM macro groups 100a and 100b. FIG. 7 is a timing chart of each phase clock when the phase control signals pc1 and pc2 are input into the RAM macro groups 100a and 100b. As illustrated in FIG. 7, because pc1 and pc2 have opposite signals, the timing of ph1 of the RAM macro group 100a coincides with the timing of ph2 of the RAM macro group 100b and the timing of ph2 of the RAM macro group 100a coincides with the timing of ph1 of the RAM macro group 100b.

In this manner, because the timing of ph1 of the RAM macro group 100a coincides with the timing of ph2 of the RAM macro group 100b and the timing of ph2 of the RAM macro group 100a coincides with the timing of ph1 of the RAM macro group 100b, the magnitude of current is constant for each phase clock. Therefore, it is possible to prevent the increase of the generation of noise and the drop of current.

As described above, the chip (the semiconductor integrated circuit) 100 according to the present embodiment adjusts a timing at which the phase control signal is turned on or off for each of the RAM macro groups 100a and 100b and distributes the adjusted phase control signal to each of the RAM macro groups 100a and 100b so that the RAM macro groups 100a and 100b do not perform the same process at the same timing. Therefore, the value of current can be constant for each phase clock and thus the increase of the generation of noise and the drop of current can be prevented.

Moreover, because the chip 100 according to the present embodiment can use the RAM macro groups 100a and 100b without changing the setting of the RAM macro groups 100a and 100b, a manufacturing cost can be reduced.

In the meantime, among the processes described in the present embodiment, all or a part of processes explained as being automatically performed may be manually performed. Alternatively, all or a part of processes explained as being manually performed may be automatically performed through a known method. In addition, the process procedures, control procedures, specific names, and information including various types of data and parameters described in the specification and illustrated in the drawings can be arbitrarily changed unless otherwise specified.

Each component of each unit illustrated in the drawings is conceptual in functional, and is not necessarily physically configured as illustrated in the drawings. That is, the specific configurations of distribution and integration of the components are not meant to be restricted to those illustrated in the drawings. Therefore, all or a part of the components may be functionally or physically distributed or integrated in arbitrary units in accordance with various types of loads and the state of use.

According to the present invention, because the control signal distributing unit adjusts a timing at which the control signal is turned ON or OFF for each of the areas and distributes the adjusted control signals to the plurality of areas so that the plurality of areas do not perform the same process at the same timing, it is possible to prevent the increase of the generation of noise and the drop of current.

Moreover, according to the present invention, because the plurality of areas includes a first area group and a second area group, and the control signal distributing unit adjusts the control signals so that a timing at which the control signal output to the first area group is turned on or off and a timing at which the control signal output to the second area group is turned on or off are opposite to each other, processes performed by the area groups can be different from each other without changing the setting of each area group, and the value of current can be substantially constant at each timing. Therefore, it is possible to prevent the increase of the generation of noise and the drop of current.

Moreover, according to the present invention, because the first area group and the second area group perform a first process whose power consumption is not less than a predetermined value for a time period for which the control signal is ON and perform a second process whose power consumption is less than the predetermined value for a time period for which the control signal is OFF, the value of current can be substantially constant at each timing.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor integrated circuit that includes a plurality of areas including a first area group and a second area group, each of the first area group and the second area group generates phase clocks in accordance with an external clock and a first control signal or a second control signal and performs a first process and a second process assigned to each of the phase clocks, the semiconductor integrated circuit comprising:
    a control signal distributing unit that adjusts the first and second control signals so that a timing at which the first control signal output to the first area group is turned on or off and a timing at which the second control signal output to the second area group is turned on or off are opposite to each other and distributes the adjusted first and second control signals to the first area group and the second area group, respectively, wherein the first area group and the second area group perform the first process for a time period for which the first control signal or the second control signal is ON and perform the second process for a time period for which the first control signal or the second control signal is OFF, power consumption of the first process being not less than a predetermined value, power consumption of the second process being less than the predetermined value.

2. A control signal distribution method for a semiconductor integrated circuit that includes a plurality of areas including a first area group and a second area group, each of the first area group and the second area group generates phase clocks in accordance with an external clock and a first control signal or a second control signal and performs a first process and a second process assigned to each of the phase clocks, the control signal distribution method comprising:
    acquiring the external clock; and
    distributing step of adjusting the first and second control signals so that a timing at which the first control signal output to the first area group is turned on or off and a timing at which the second control signal output to the second area group is turned on or off are opposite to each other and distributing the adjusted first and second control signals to the first area group and the second area group, respectively, wherein the first area group and the second area group perform the first process for a time period for which the first control signal or the second control signal is ON and perform the second process for a time period for which the first control signal or the second control signal is OFF, power consumption of the first process being not less than a predetermined value, power consumption of the second process being less than the predetermined value.

* * * * *